United States Patent [19]
Donmoyer et al.

[11] 4,314,312
[45] Feb. 2, 1982

[54] PROGRAMMING MEANS

[75] Inventors: William L. Donmoyer, Noblesville, Ind.; Jon A. Fortuna, Mechanicsburg, Pa.

[73] Assignee: AMP Incorporated, Harrisburg, Pa.

[21] Appl. No.: 139,911

[22] Filed: Apr. 14, 1980

[51] Int. Cl.³ .............................................. H05K 1/18
[52] U.S. Cl. .................................... 361/400; 200/46; 339/17 F; 361/408
[58] Field of Search ............. 361/400, 408; 339/17 F, 339/17 CF, 17 C; 200/46

[56] References Cited
U.S. PATENT DOCUMENTS

| | | | |
|---|---|---|---|
| 3,112,378 | 11/1963 | Holzer | 200/46 X |
| 3,221,095 | 11/1965 | Cook | 339/17 F X |
| 3,352,981 | 11/1967 | Ekers | 200/46 |
| 3,702,190 | 11/1972 | Waldrop | 200/46 X |
| 3,742,485 | 6/1973 | Summers | 200/46 X |
| 4,169,641 | 10/1979 | Olsson | 339/17 F |
| 4,172,626 | 10/1979 | Olsson | 339/17 F |
| 4,181,386 | 1/1980 | Olsson | 359/17 F |

OTHER PUBLICATIONS

Benjamin et al., Programming for Printed Circuitry, IBM Tech. Dis. Bull., vol. 2, No. 1, Jun. 1959, p. 54.

*Primary Examiner*—Richard R. Kucia
*Attorney, Agent, or Firm*—Frederick W. Raring

[57] ABSTRACT

A circuit programming means for establishing a desired circuit pattern selected from a variety of circuit options comprises a circuit board having a plurality of side-by-side circuit board conductors thereon. A conductive connector clip is mounted on the circuit board in straddling relationship to the conductors and has contact springs extending therefrom which are in alignment with the conductors. A removable insulating program control means is positioned between a number of the springs and their associated circuit board conductors, the insulating means having openings so that at least two of the contact springs are in electrical contact with their associated conductors. The selected circuit pattern can be changed by merely moving the program control means and inserting a different program control means to commonly connect those conductors which will produce the desired circuit option.

6 Claims, 6 Drawing Figures

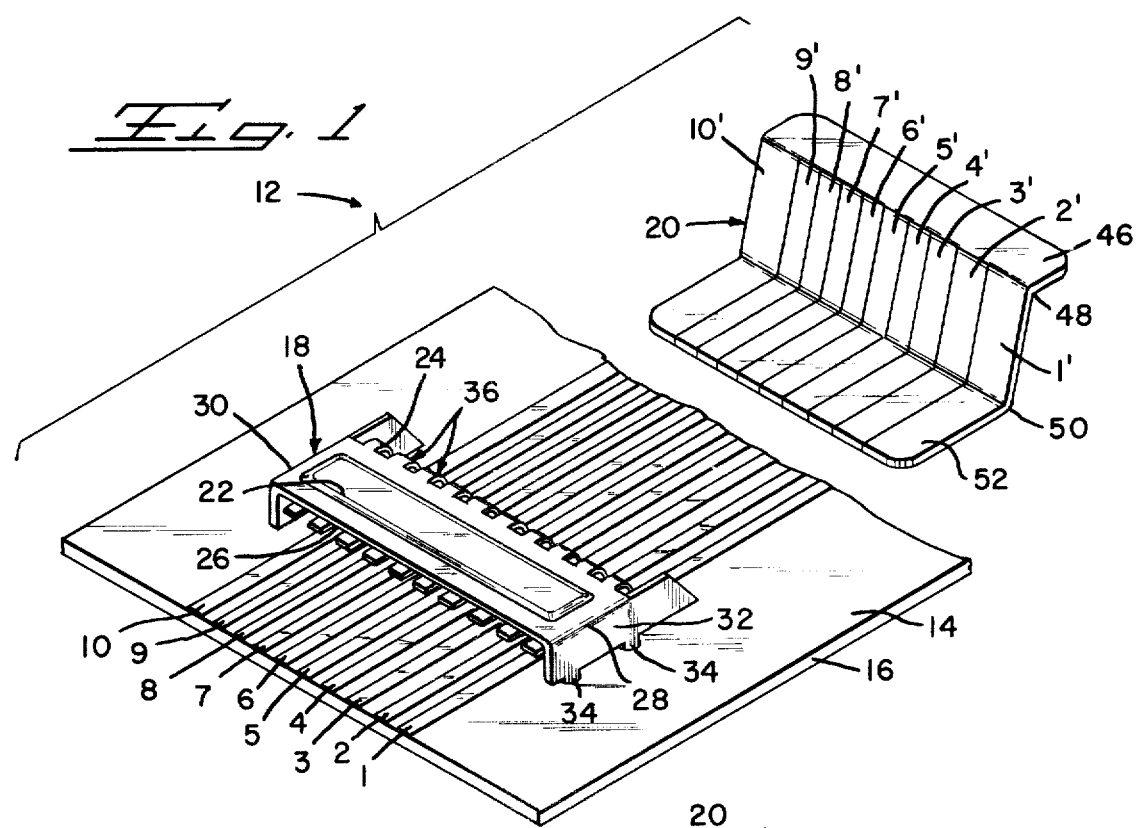
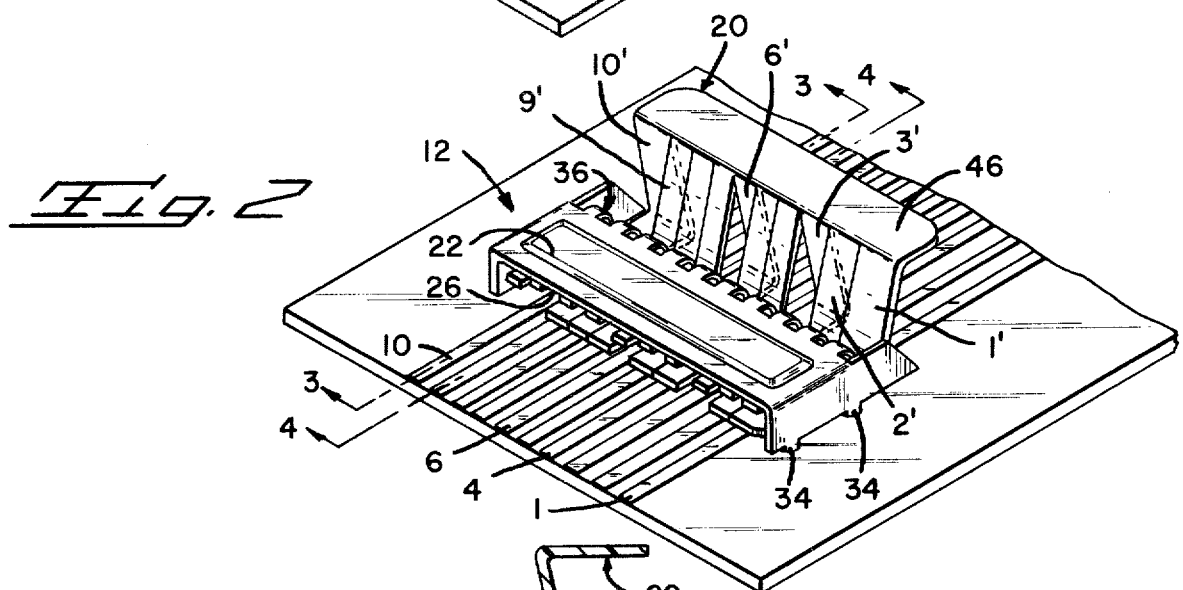
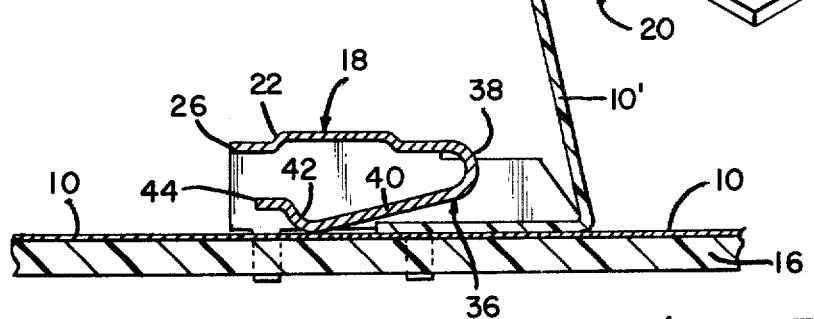

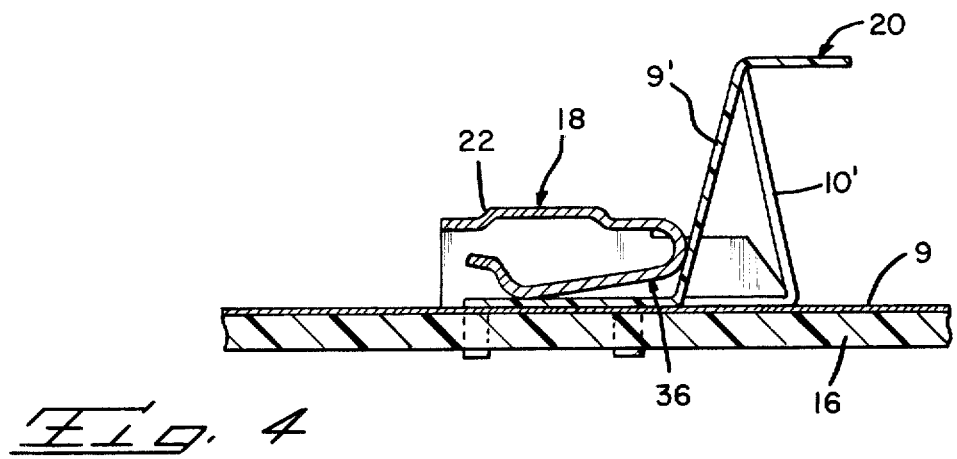
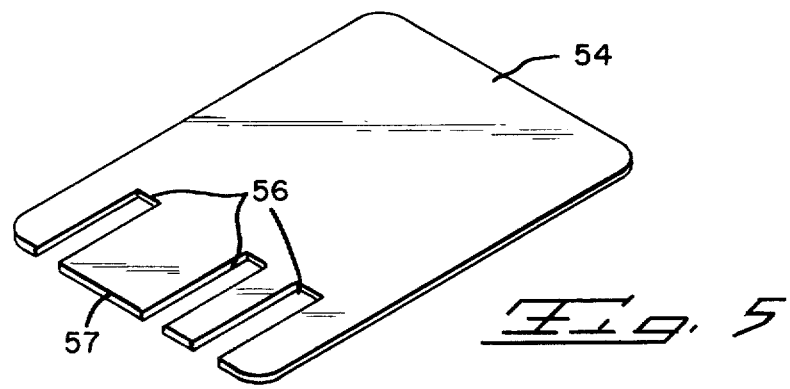
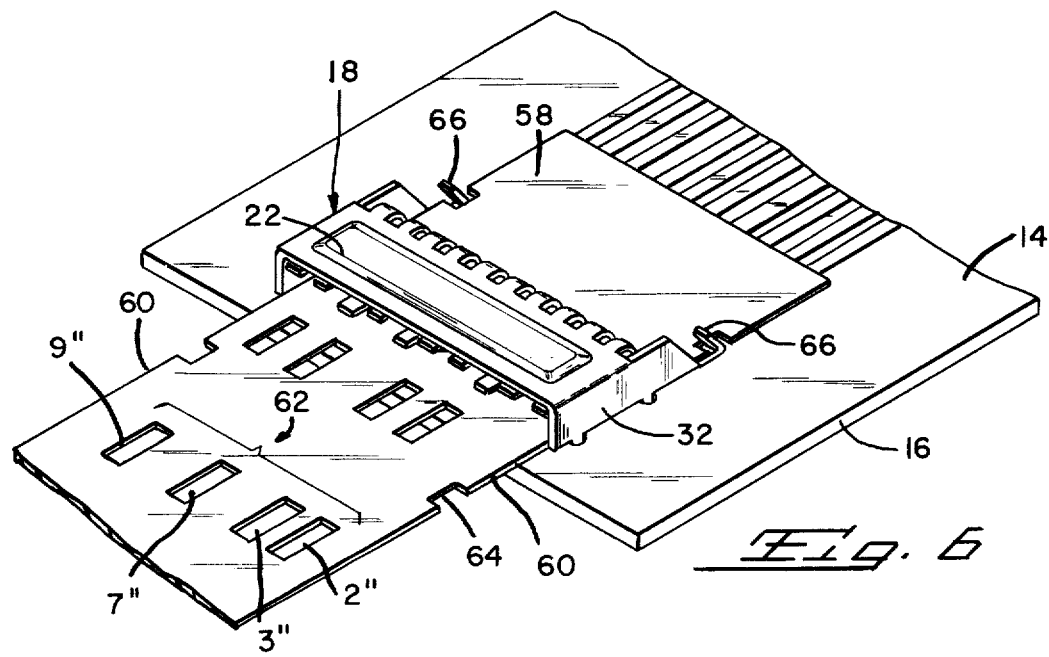

PROGRAMMING MEANS

FIELD OF THE INVENTION

This invention relates to programming systems of the type used to select a predetermined desired circuit from among a variety of possible circuits. Programming means in accordance with the invention are particularly intended for use in electronic amusement devices, door locks, annunciator systems, and under other circumstances where relatively simple and low cost programming means are required

BACKGROUND OF THE INVENTION

A wide variety of circuit programming systems are currently available and are being used, such as cross connect pin boards, matrix rotary switches, systems having slide switches therein, and card readers for use with credit cards or other program cards. Many of these systems are particularly intended for use under only relatively specialized circumstances and that have capacities as regards the number of circuit options which are tailored to the particular conditions of the intended use. Many of these systems are, therefore, relatively high in cost and are not suitable for use under circumstances where an extremely low cost durable programming system is required and only a limited number of circuit options are required. For example, amusement game devices, annunciator systems having multiple stations which must be independently identified when a given station is energized, door locks, and garage door opening devices all require a low cost durable programming system which need not have an extremely large number of possible circuit options as does, for example, a credit card. The present invention is directed to the achievement of a relatively simple and durable programming system which is suitable for applications of this type.

A programming system in accordance with the invention comprises a circuit board having a plurality of side-by-side circuit board conductors thereon and having a clip member of conductive metal mounted on the board in straddling relationship to the circuit board conductors. The clip member has a plurality of individual contact springs extending therefrom equal to the number of circuit board conductors with one spring being normally against, and in electrical contact with, an associated circuit board conductor. A circuit option is established by insulating some of the springs from their associated conductors and leaving the remaining spring members in contact with their conductors. The preselected spring members are electrically separated from their associated conductors by an insulating member which is positioned on the surface board and between the preselected spring members and their associated conductors. The insulating member may be in the form of a card having openings therein located such that the preselected spring members engage their associated conductors or it may be in a form such that the program can be changed by the holder of the insulating member such as a card having individual insulating fingers, one finger for each circuit board conductor. The fingers are movable independently of each other so that selected fingers can be moved in a way such that the associated spring is permitted to engage its associated conductor.

DESCRIPTION OF THE DRAWINGS

FIG. 1 is a perspective view of a programming means in accordance with one embodiment of the invention showing the program control insulating means exploded from the circuit board and the connector clip.

FIG. 2 is a view similar to FIG. 1 but showing the insulating means positioned on the circuit board in a manner such that predetermined circuit board conductors are commonly connected.

FIGS. 3 and 4 are views taken along the lines 3—3 and 4—4 respectively, of FIG. 2.

FIG. 5 is a perspective view of an alternative form of program control insulating member.

FIG. 6 is a perspective view of a programming system having a card type insulating member which provides a plurality of programs.

Referring first to FIGS. 1-4, the programming means in accordance with the invention comprises a circuit board 16, a connector clip 18, and an insulating member 20. The circuit board 16 has a plurality of parallel side-by-side circuit board conductors on the upper surface 14 thereof, as indicated by the reference numerals 1-10 in FIG. 1. The programming means serves selectively to commonly connect predetermined conductors among the ten conductors, as will be explained below.

The connector clip 18 may be of the general type described fully in U.S. Pat. No. 4,181,386 and comprises a rectangular clip bar 22 having parallel side edges 24, 26 and ends 28, 30. Flanges 32 extend from the ends to the surface 14 and mounting ears 34 extend from the lower edges of the flanges through openings in the circuit board, as shown. These mounting ears may be clinched or otherwise secured to the underside of the circuit board to secure the clip in position on the surface 14.

A plurality, equal to the number of conductors 1-10, of springs 36 extend from the side edge 24 of the clip bar with each spring being in alignment with one of the conductors. Each spring is reversely bent, as shown at 38, and has a spring arm portion 40 which extends towards the surface 14 so that the arcuate contact portion 42 of each spring bears against its associated conductor, as shown in FIG. 3. The free ends of the springs 44 are recessed from the lefthand end of the clip and the springs are flexible upwardly, as illustrated in FIG. 4, so that they can be disengaged from their associated conductors 1-10.

The clip 18 may be of any suitable metal so long as it is conductive and has sufficient resilience to maintain good electrical contact between the spring members and the conductors on the circuit board. The clip member can, therefore, be of brass, or of steel plated with tin, in order to render it sufficiently conductive for purposes of the invention.

The insulating member 20 of the embodiment of FIGS. 1-4 comprises a single sheet of plastic which has been sheared and formed, as shown in FIGS. 1 and 2, to provide a rectangular tab portion 46 having side-by-side insulating finger members 1'-10' extending from one side edge of the tab. These insulating members extend downwardly from the plane of the tab, as shown at 48, and are bent as shown at 50 to provide parallel side-by-side free end portions 52. The insulating member of FIG. 1 should be of a material such that the fingers are hinged to the tab portion 46 at 48 and the two sections of the fingers are hinged to each other at the transition sections 50, for reasons which will be explained below.

A variety of plastic materials, including polypropylene, acetal, and nylon have the characteristic of being able to form integral hinges of this type which are capable of repeated flexing without failure.

In use, the insulator member 20 is positioned as shown in FIG. 3, with the free end portions 52 of the finger members on the surface 14 of the circuit board and the insulator member is then pushed leftwardly until the free ends 52 of the fingers are beneath the contact portions 42 of the spring members. At this time, all of the spring members will be electrically insulated from the conductors 1-10 on the circuit board. In order to establish a desired circuit pattern, it is merely necessary to push on preselected finger members from the left, as viewed in the drawing, and cause these preselected finger members to be moved rearwardly so that their free end portions 52 are not beneath the contact springs 36. The contact springs will then move against the conductors on the circuit board and commonly connect those conductors which are contacted by their contact springs. Thus in FIG. 2, the fingers 3', 6', and 10' have been pushed rearwardly and conductors 3, 6, and 10 will, therefore, each be in electrical contact with the clip member 18 and will thereby be commonly connected. The program or circuit option can be changed by merely pushing the fingers 3', 6', and 10' inwardly and pushing another combination of finger members rearwardly.

FIG. 5 shows a simple rigid card 54 having notches 56 punched therein adjacent to one of its ends 57. When this card is pushed under the clip, only those spring members which are in alignment with the notches 56 will remain in electrical contact with their associated conductors, thereby to establish a predetermined circuit.

FIG. 6 shows another embodiment in which the insulator 58 comprises a rectangular card having parallel side edges 60 and having groups 62 of punched holes therein. Each group of holes forms a row extending normally of the side edges 60 and individual holes of each group are in alignment with predetermined conductors on the circuit board. The group 62, shown at the left, in FIG. 6, thus has openings 2", 3", 7", and 9" which are in alignment with the conductors identified by the same reference numerals. Advantageously, notches 64 are provided in the side edges and are dimensioned to receive locating ears 66 which extend from the flanges 32 of the clip 18. The notches 66 thus serve to position a predetermined set or group 62 of openings in the card 58 beneath the clip bar and thereby establish a given circuit option selected from a plurality of possible circuit options as determined by the locations of the openings in the groups 62 of openings.

The embodiment of the invention shown in FIG. 6 is particularly useful for amusement type devices which require a change to a program, while the embodiment of FIG. 5 would be useful, for example, for a locking device for a door used under circumstances such that a large number of "keys" must be distributed. Each key would consist of a card, as shown in FIG. 5, and the program or circuit required for opening the door could be changed by simply changing the circuitry in the locking mechanism and distributing a new set of punched cards to authorized card holders.

Under some circumstances, it may be desirable to electrically connect the clip to one conductor on the circuit board by means of one of the mounting ears 34. For example, one of the mounting ears can be soldered to a conductor on either the upper surface or the underside of the circuit board. This arrangement would result in a greater number of programming options in that all of the parallel conductors 1-10 would be available for programming purposes.

We claim:

1. Programming means for establishing a predetermined circuit selected from a plurality of possible circuits, said programming means comprising:
   a circuit board having at least three side-by-side circuit board conductors on one surface thereof,
   a conductive connector clip mounted on said one surface, said clip comprising a clip bar having integral mounting means extending therefrom, said clip being mounted on said circuit board with said clip bar extending transversely of, and being spaced from said circuit board conductors,
   a plurality of individual spring members integral with said clip bar and extending towards said one surface of said circuit board, each of said spring members being in alignment with, and resiliently biased towards, one of said circuit board conductors, and
   removable insulating program control means between said springs and a number of said circuit board conductors, at least two of said spring members being in electrical contact with their associated circuit board conductors,
   said insulating program control means comprising a plurality of side-by-side individual insulating members, each of said members being positioned between one of said circuit board conductors and its associated spring member and serving to insulate each circuit board conductor from its associated spring member, said individual insulating members being individually movable from between said circuit board conductors and said spring members whereby,
   said at least two circuit board conductors are selectively connected to each other.

2. Programming means as set forth in claim 1, said connector clip having flanges extending from said ends to said one surface, said mounting means comprising mounting ears extending from said flanges and into said circuit board.

3. Programming means as set forth in claim 2, said clip having side edges extending between said ends, said spring members comprising cantilever springs extending from one of said side edges, each of said springs being reversely bent and having a spring arm portion extending towards said one surface of said circuit board.

4. Programming means as set forth in claim 1, said clip being mounted on said circuit board by means of flanges extending from said ends of said clip bar to said one surface, said clip being electrically connected to one conductor by means of one of said flanges.

5. Programming means as set forth in claim 1, said insulating means comprising a one-piece member comprising a strip having said individual insulating members extending from one side edge thereof.

6. Programming means intended for mounting on a circuit board, said circuit board having a plurality of side-by-side circuit board conductors on one surface thereof, said programming means comprising:
   a connector clip of the type comprising a generally rectangular clip bar having ends and having side edges extending between said ends, mounting means extending from said ends of said clip bar for mounting said clip on said one surface with said clip bar spaced from, and extending transversely of, said circuit board conductors, a plurality of cantilever springs extending from one of said side edges, said springs extending in the same direction as said mounting means and being spaced apart by the same distance as said circuit board conductors, and insulating means dimensioned to be positioned between said springs and said circuit board conductors when said connector clip is mounted on said circuit board, said insulating means having opening means therein for permitting at least two of said springs to contact at least two of said circuit board conductors, said insulating comprising a programming card having a plurality of side-by-side individual insulating members, said members having a center-to-center spacing which is the same as the center-to-center spacing of said circuit board conductors, said individual insulating members being individually movable from between said springs and said circuit board conductors to provide said opening means whereby, upon mounting said connector clip on said circuit board in straddling relationship to said circuit board conductors, and upon placement of said insulating means between said spring members and said one surface of said circuit board, said at least two circuit board conductors are selectively connected to each other.

* * * * *